(12) United States Patent
Fel

(10) Patent No.: US 10,598,728 B2
(45) Date of Patent: *Mar. 24, 2020

(54) SCAN CHAIN CIRCUIT SUPPORTING LOGIC SELF TEST PATTERN INJECTION DURING RUN TIME

(71) Applicant: STMicroelectronics (Grenoble 2) SAS, Grenoble (FR)

(72) Inventor: Bruno Fel, Saint Egreve (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 80 days.

This patent is subject to a terminal disclaimer.

(21) Appl. No.: 15/867,285

(22) Filed: Jan. 10, 2018

(65) Prior Publication Data

US 2018/0128876 A1  May 10, 2018

Related U.S. Application Data

(63) Continuation of application No. 15/071,342, filed on Mar. 16, 2016, now Pat. No. 9,897,653.

(51) Int. Cl.
*G01R 31/3177* (2006.01)
*G01R 31/3185* (2006.01)

(52) U.S. Cl.
CPC . *G01R 31/3177* (2013.01); *G01R 31/318547* (2013.01); *G01R 31/318563* (2013.01)

(58) Field of Classification Search
CPC ........ G01R 31/3177; G01R 31/318563; G01R 31/318547
See application file for complete search history.

(56) References Cited

U.S. PATENT DOCUMENTS

| 5,909,453 | A | * | 6/1999 | Kelem | ........... | G01R 31/318558 |
| | | | | | | 365/201 |
| 8,558,586 | B1 | | 10/2013 | Martin et al. | | |
| 9,599,672 | B2 | * | 3/2017 | Abhishek | ....... | G01R 31/318541 |
| 2005/0055615 | A1 | * | 3/2005 | Agashe | .......... | G01R 31/318552 |
| | | | | | | 714/727 |

(Continued)

FOREIGN PATENT DOCUMENTS

CN          206132934 U      4/2017

OTHER PUBLICATIONS

DE Search Report and Written Opinion for DE 102016116717.7 dated Mar. 29, 2017 (7 pages).

(Continued)

*Primary Examiner* — Thien Nguyen
(74) *Attorney, Agent, or Firm* — Crowe & Dunlevy

(57) ABSTRACT

A scan chain for testing a combinatorial logic circuit includes a first scan chain path of flip-flops connected to the combinatorial logic circuit for functional mode operation during runtime of the combinatorial logic circuit. A second scan chain path of flip-flops is also connected to the combinatorial logic circuit and supports both a shift mode and a capture mode. The second scan chain path operates in shift mode while the first scan chain path is connected to the combinatorial logic circuit for functional mode operation. The second scan chain is then connected to the combinatorial logic circuit when run time is interrupted and operates in capture mode to apply the test data to the combinatorial logic circuit.

15 Claims, 4 Drawing Sheets

(56) References Cited

U.S. PATENT DOCUMENTS

| | | | |
|---|---|---|---|
| 2008/0255780 A1* | 10/2008 | Waayers | G01R 31/318536 702/58 |
| 2011/0018613 A1 | 1/2011 | Wang | |
| 2011/0047426 A1* | 2/2011 | Touba | G01R 31/318547 714/729 |
| 2011/0298491 A1* | 12/2011 | Engels | H03K 3/037 326/16 |
| 2013/0311843 A1 | 11/2013 | Tekumalla et al. | |
| 2014/0047293 A1 | 2/2014 | Lamb et al. | |
| 2015/0346279 A1* | 12/2015 | Douskey | G01R 31/318536 714/727 |
| 2016/0134279 A1 | 5/2016 | Sicard | |
| 2016/0169967 A1* | 6/2016 | Douskey | G01R 31/318541 714/726 |
| 2016/0169972 A1* | 6/2016 | Douskey | G01R 31/318541 714/726 |
| 2016/0266201 A1* | 9/2016 | Waayers | G01R 31/318552 |

OTHER PUBLICATIONS

First Office Action and Search Report from co-pending CN Appl. No. 201610798017.5 dated Apr. 19, 2019 (8 pages).

* cited by examiner

SCAN CHAIN CIRCUIT SUPPORTING LOGIC SELF TEST PATTERN INJECTION DURING RUN TIME

CROSS-REFERENCE TO RELATED APPLICATION

This application is a continuation of United States application for patent Ser. No. 15/071,342 filed Mar. 16, 2016, the disclosure of which is incorporated by reference.

TECHNICAL FIELD

The present disclosure relates to a circuit supporting permanent hardware error detection at system run time.

BACKGROUND

As the technology for manufacturing integrated circuits advances, more logic functions are included in a single integrated circuit device, thereby increasing the number of gates on a single semiconductor device. The gates are interconnected to perform multiple and complex functions.

A manufacturing defect or a defect due to circuit aging may prevent the integrated circuit from performing all of the designed functions. To detect such errors, verification of the design of the integrated circuit device is conducted and various types of electrical tests are performed on the integrated circuit device. Those tests may, for example, be performed at manufacturing time (referred to in the art as a design for test (DFT)), or at system boot time. Now, for example in connection with safety-related applications, there is also a need to perform such tests at software runtime.

As the complexity of the integrated circuit device increases, so does the cost and complexity of verifying and electrically testing each of the elements in the integrated circuit. Modern integrated circuits usually incorporate a variety of design-for-test (DFT) structures to enhance their testability. Typically, the DFT structures are based on a scan design, where scan test data is provided to an input test pin, passed to a scan chain embedded into the integrated circuit, and executed by the logic of the circuit. The results of such execution are exported to an output test pin for evaluation. When in manufacturing test mode, the input test pin can be driven directly by automated test equipment (ATE). When in system operating mode, an on-chip self test function (for example, a built-in self test (BIST)) can provide the scan test data and evaluate the results of the execution.

In whatever circuit operating mode (i.e., manufacturing test mode, boot time test mode or system run time test mode), the testing can be a time consuming activity. Thus, there is interest in identifying ways to reduce the testing time, especially in the context of safety sensitive applications where system available needs to be optimized.

More particularly, in connection with the system run time test mode, it is important for the testing operation to interrupt run time operation of the system for as short a time duration as possible. Testing time includes the time taken to load the test pattern into the scan chain, the time taken to process the test pattern in the circuitry and the time take to read the test result out from the scan chain. In prior art schemes, it is known to stop the run time functional operation of the system, perform the test mode operation, and then resume the run time functional operation. This scheme induces a time penalty on system readiness since the run time functional operation has been interrupted to permit the test mode operation. There is a need in the art for a means to reduce the length of time that the run time functional operation is interrupted in support of test mode operation. There would be an advantage if the injection of a subsequent test pattern to the scan chain could be made during run time functional operation.

SUMMARY

According to an embodiment, a circuit comprises: a first flip-flop having a first data input, a first scan input configured to receive first scan data, a first data output and a first scan output; a second flip-flop having a second data input, a second scan input configured to receive second scan data, a second data output and a second scan output; a first multiplexer circuit having a first input coupled to the first data output and a second input coupled to the second data output, said first multiplexer having an output coupled to an input of a combinatorial logic circuit; wherein said first flip-flop operates in a shift mode in response to a first logic state of a first scan enable signal and operates in a capture mode in response to a second logic state of the first scan enable signal; wherein said second flip-flop operates in the shift mode in response to a first logic state of a second scan enable signal and operates in the capture mode in response to a second logic state of the second scan enable signal; and wherein said first multiplexer circuit is controlled by a first logic value of a select signal to couple the first input to the output when the first flip-flop supports run time operation of the combinatorial logic circuit and the second scan enable signal is in the first logic state to shift test data into the second flip-flop.

According to an embodiment, a circuit comprises: a first scan chain comprised of a plurality of first flip-flops; a second scan chain comprised of a plurality of second flip-flops; a first multiplexer circuit having a first input coupled to a data output of the second scan chain and a second input coupled to receive first test data, said first multiplexer having an output coupled to a scan input of the first scan chain; a second multiplexer circuit having a first input coupled to a data output of the first scan chain and a second input coupled to receive second test data, said second multiplexer having an output coupled to a scan input of the second scan chain.

According to an embodiment, a circuit for testing a combinatorial logic circuit comprises: a first scan chain comprised of a plurality of first flip-flops connected to the combinatorial logic circuit for functional mode operation during run time of the combinatorial logic circuit; a second scan chain comprised of a plurality of second flip-flops connected to the combinatorial logic circuit and supporting a shift mode and a capture mode; wherein the second scan chain operates in shift mode to receive test data while the first scan chain path is connected to the combinatorial logic circuit for functional mode operation during run time; and wherein the second scan chain is connected to the combinatorial logic circuit when run time is interrupted and operates in capture mode to apply the test data to the combinatorial logic circuit.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1:
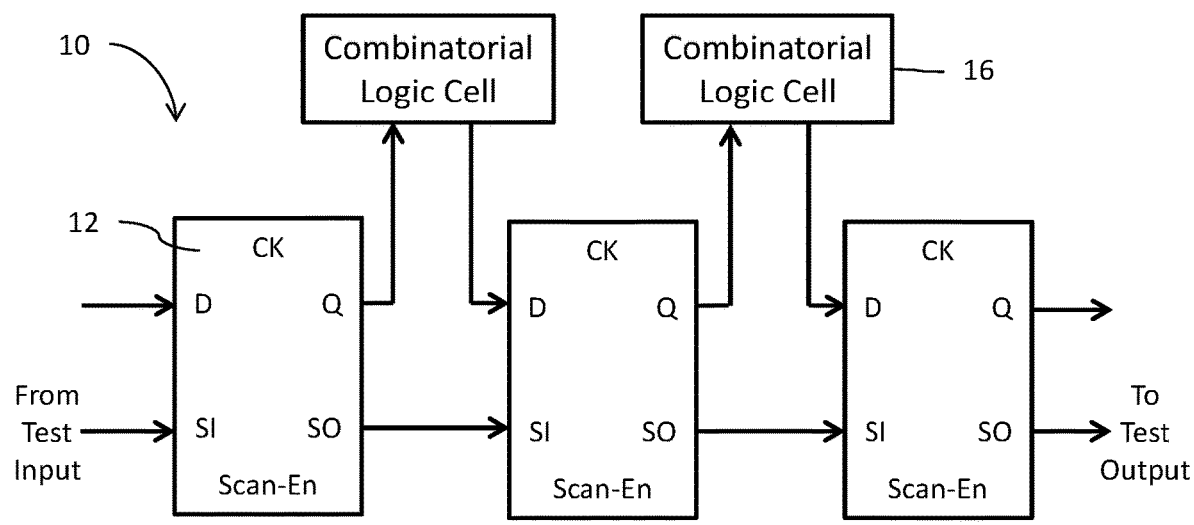
FIG. 1 is a block diagram of a scan chain based design-for-test (DFT)

Reference is now made to FIG. 1 showing a block diagram of a scan chain based design-for-test (DFT). The scan chain 10 includes a plurality of scan chain cells, wherein each cell comprises a flip-flop 12. Each flip-flop 12 includes a data input (D) and a scan input (SI). Each flip-flop 12 further includes a data output (Q) and a scan output (SO). Each flip-flop 12 is further configured to receive a same clock signal at a clock input (CK). The mode of operation of each flip-flop 12 is controlled by a scan enable signal applied to the scan enable (Scan-En) input of each flip-flop 12. When scan enable is in a first logic state, the flip-flop 12 responds to the clock signal by shifting the data received at the scan input (SI) to the data output (Q) and scan output (SO), this is referred to as the shift mode of operation. When scan enable is in a second logic state, the flip-flop 12 responds to the clock signal by shifting the data received at the data input (D) to the data output (Q) and scan output (SO), this is referred to as the capture mode of operation.

In the scan chain 10, the scan output (SO) of one flip-flop 12 is coupled to the scan input (SI) of the next successive flip-flop 12 in the scan chain 10 (i.e., is coupled to the next cell in the series of cells making up the scan chain). The scan input (SI) of the first flip-flop 12 in the scan chain 10 is coupled to receive test data from a test input. The scan output (SO) of the last flip-flop 12 in the scan chain 10 is coupled to output test result data to a test output. The data output (Q) of one flip-flop 12 is coupled to an input of a combinatorial logic cell 16 that is being tested. The combinatorial logic cell 16 includes a number of interconnected logic circuits designed to performed one or more functional operations. An output of the combinatorial logic cell 16 is coupled to the data input (D) of the next successive flip-flop 12 in the scan chain 10 (i.e., is coupled to the next cell in the series of cells making up the scan chain). The data input (D) of the first flip-flop 12 in the scan chain 10 may be configured to receive a signal from another hardware function on the chip or a chip-level input pad. The data output (Q) of the last flip-flop 12 in the scan chain 10 is typically used to either drive the input of another hardware function on the chip or a chip-level output pad.

Figure 2:
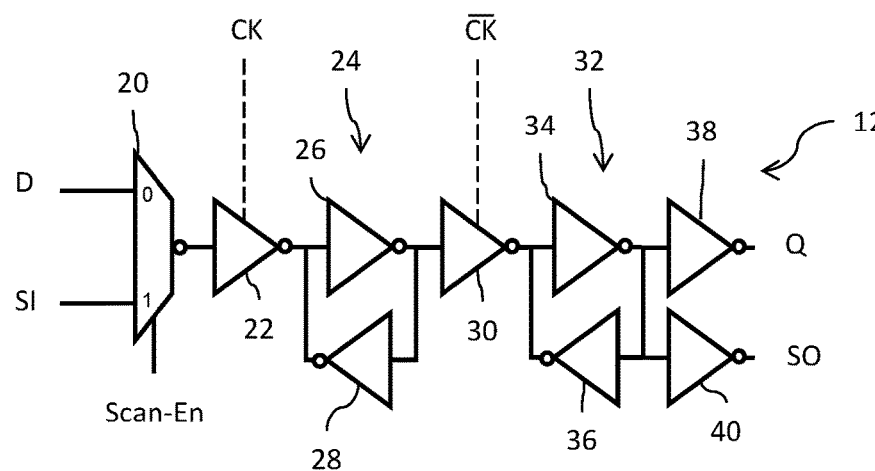
FIG. 2 is a circuit for one example of a flip-flop used in a scan chain.

The flip-flop 12 may have any suitable circuit design. FIG. 2 shows the circuit design for one example of the flip-flop 12. The flip-flop 12 includes a multiplexer 20 having inputs coupled to the data input (D) and the scan input (SI). The multiplexer 20 selects one of those inputs for inverted output in response to the logic state of the scan enable (Scan-En) signal. A clocked inverter 22 has an input coupled to the output of the multiplexer 20. The clocked inverter 22 is controlled by the clock signal (CK). A first latch 24 is formed by cross-coupled inverters 26 and 28 and has an input coupled to the output of the clocked inverter 22. A clocked inverter 30 an input coupled to the output of the first latch 24. The clocked inverter 30 is controlled by the logical inverse of the clock signal (CK). A second latch 32 is formed by cross-coupled inverters 34 and 36 and has an input coupled to the output of the clocked inverter 30. A first output inverter 38 has an input coupled to the output of the second latch 32 and provides the data output (Q). A second output inverter 40 has an input coupled to the output of the second latch 32 and provides the scan output (SO).

Figure 3:
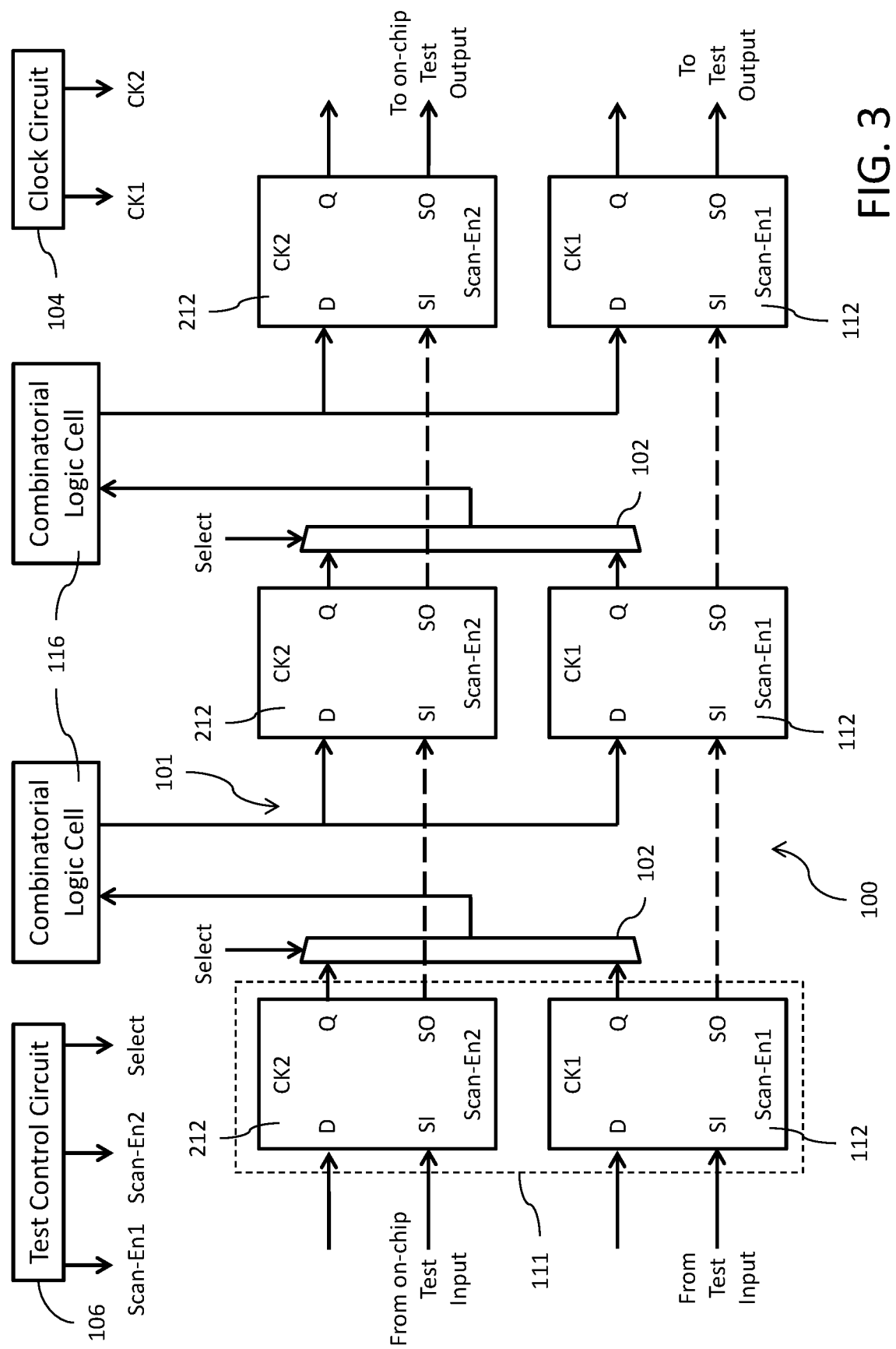
FIG. 3 a block diagram of a scan chain circuit configured to support permanent hardware error detection at system runtime.

Reference is now made to FIG. 3 a block diagram of a scan chain circuit configured to support permanent hardware error detection at system runtime. The scan chain circuit comprises a plurality of cells 111 coupled in series wherein each cell includes a pair of flip-flops including a first flip-flop 112. The first flip-flops 112 are connected to form a first scan chain 100. Each first flip-flop 112 includes a data input (D) and a scan input (SI). Each first flip-flop 112 further includes a data output (Q) and a scan output (SO). Each first flip-flop 112 is further configured to receive a same first clock signal at a clock input (CK1). The mode of operation of each first flip-flop 112 is controlled by a scan enable signal applied to a first scan enable (Scan-En1) input of each first flip-flop 112. When the first scan enable signal is in a first logic state, the flip-flop 112 responds to the first clock signal by shifting the data received at the scan input (SI) to the data output (Q) and scan output (SO) (shift mode of operation). When first scan enable signal is in a second logic state, the first flip-flop 112 responds to the clock signal by shifting the data received at the data input (D) to the data output (Q) and scan output (SO) (capture mode of operation). The first flip-flops 112 may, for example, each comprise the circuit shown in FIG. 2.

In the scan chain 100, the scan output (SO) of one first flip-flop 112 is coupled to the scan input (SI) of the next successive first flip-flop 112 in the scan chain 100 (i.e., is coupled to the next cell in the series of cells making up the scan chain). The scan input (SI) of the first one of the first flip-flops 112 in the scan chain 100 is coupled to receive test data from a test input. The scan output (SO) of the last one of the first flip-flops 112 in the scan chain 100 is coupled to output test result data to a test output. The data output (Q) of the first flip-flop 112 may be coupled to a first input of a multiplexer 102. An output of the multiplexer 102 is coupled to an input of a combinatorial logic cell 116 that is being tested. An output of the combinatorial logic cell 116 is coupled to the data input (D) of the next successive first flip-flop 112 in the scan chain 100 (i.e., is coupled to the next cell in the series of cells making up the scan chain). The data input (D) of the first one of the first flip-flops 112 in the scan chain 100 may be configured to receive a signal from another hardware function on the chip or a chip-level input pad. The data output (Q) of the last one of the first flip-flops 112 in the scan chain 100 is typically used to either drive the input of another hardware function on the chip or a chip-level output pad.

Each cell 111 further comprises a second flip-flop 212. The second flip-flops 212 are connected to form a second scan chain 101. Each second flip-flop 212 includes a data input (D) and a scan input (SI). Each second flip-flop 212 further includes a data output (Q) and a scan output (SO). Each second flip-flop 212 is further configured to receive a same second clock signal at a clock input (CK2). The mode of operation of each second flip-flop 212 is controlled by a scan enable signal applied to a second scan enable (Scan-En2) input of each second flip-flop 212. When the second scan enable signal is in a first logic state, the second flip-flop 212 responds to the second clock signal by shifting the data received at the scan input (SI) to the data output (Q) and scan output (SO) (shift mode of operation). When second scan enable signal is in a second logic state, the second flip-flop 212 responds to the clock signal by shifting the data received at the data input (D) to the data output (Q) and scan output (SO) (capture mode of operation). The second flip-flops 212 may, for example, each comprise the circuit shown in FIG. 2.

In the scan chain 101, the scan output (SO) of one second flip-flop 212 is coupled to the scan input (SI) of the next successive second flip-flop 212 in the scan chain 100 (i.e., is coupled to the next cell in the series of cells making up the scan chain). The scan input (SI) of the first one of the second flip-flops 212 in the scan chain 101 is coupled to receive test data from an on-chip test input (such as, for example, on-chip test generation logic circuitry). The scan output (SO) of the last one of the second flip-flops 212 in the scan chain 100 is coupled to output test result data to an on-chip test output (such as, for example, on-chip test checker logic circuitry). The data output (Q) of the second flip-flop 212 may be coupled to a second input of the multiplexer 102. As discussed above, the output of the multiplexer 102 is coupled to an input of a combinatorial logic cell 116 that is being tested. An output of the combinatorial logic cell 116 is coupled to the data input (D) of the next successive second flip-flop 212 in the scan chain 101 (i.e., is coupled to the next cell in the series of cells making up the scan chain). The data input (D) of the first one of the second flip-flops 212 in the scan chain 101 may be configured to receive a signal from another function on the chip. The data output (Q) of the last one of the second flip-flops 212 in the scan chain 100 is typically used to drive another function on the chip.

The first and second clock signals are generated by a clock circuit 104.

The multiplexer 102 is controlled by a select signal (Select). When the select signal is in a first logic state, the multiplexer passes the signal at the first input (from the output Q of the first flip-flop 112) to the input of the combinatorial logic cell 116. The mode of operation of the first flip-flops 112 is controlled by the first scan enable signal (Scan_En1) such that: when the first scan enable signal is in the first logic state (corresponding to shift mode) data from the scan inputs (SI) is passed to the data output (Q) and scan output (SO), and when the first scan enable signal is in the second logic state (corresponding to capture mode) data from the data input (D) is passed to the data output (Q) and scan output (SO). Conversely, when the select signal is in a second logic state, the multiplexer passes the signal at the second input (from the output Q of the second flip-flop 212) to the input of the combinatorial logic cell 116. The mode of operation of the second flip-flops 212 is controlled by the second scan enable signal (Scan En2) such that: when the second scan enable signal is in the first logic state (corresponding to shift mode) data from the scan inputs (SI) is passed to the data output (Q) and scan output (SO), and when the second scan enable signal is in the second logic state (corresponding to capture mode) data from the data input (D) is passed to the data output (Q) and scan output (SO).

Figure 4:
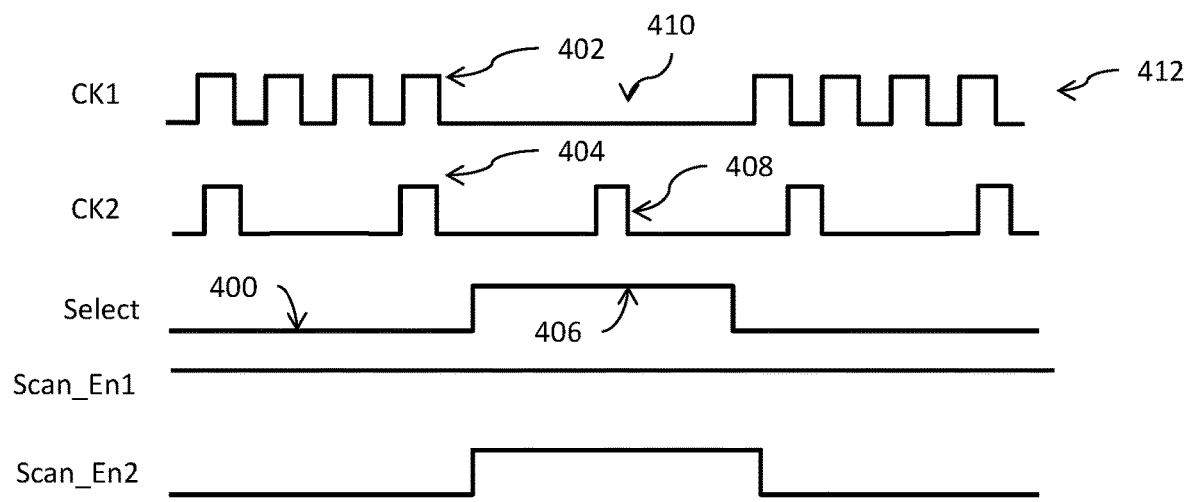
FIG. 4 is a waveform diagram for operation of the circuit of FIG. 3.

The scan chain 100 operates as follows and as shown in the timing diagrams of FIG. 4.

When the select signal is in the first logic state (reference 400), the multiplexers 102 pass the outputs of each first flip-flop 112 to the corresponding inputs of the combinatorial logic cells 116 in response to clock CK1 (reference 402). In connection with this operation, the first scan enable signal is in the second logic state (corresponding to capture mode). This corresponds to run-time functional operation of the combinatorial logic cells 116. While this is occurring, the second scan enable signal is in the first logic state (corresponding to shift mode) and data from the scan inputs (SI) is passed to the data output (Q) and scan output (SO) of each second flip-flop 212 in response to clock CK2 (reference 404).

When the select signal now transitions to the second logic state (reference 406), the multiplexers 102 pass the outputs of each second flip-flop 212 to the corresponding inputs of the combinatorial logic cells 116 in response to clock CK2 (reference 408). In connection with this operation, the second scan enable signal is in the second logic state (corresponding to capture mode) while the first scan enable signal remains in the second logic state (capture mode) and the first clock signal CK1 is inactive (reference 410) and run-time is interrupted. It will be noted that the choice of a relatively lower clock frequency for CK2 versus a relatively higher clock frequency for CK1 is mainly driven by power consumption considerations. When the time duration of run-time interruption expires, the select signal transitions back to the first logic state and the second scan enable signal transitions back to the first logic state.

The foregoing supports runtime testing of the combinatorial logic. The first and second flip-flops sustain functional path (through the first flip-flops) and pattern shift (through the second flip-flops) at the same time. Because of this, it is possible to load the pattern while in functional mode and thereafter execute the test pattern thus minimizing the time period during which the combinatorial logic is not available. In this connection, it will be noted that the pattern shift through the second flip-flops 212 in shift mode originates from the on-chip test generation logic while run-time functional path operation is being executed using the first flip-flops 112 in capture mode. When such run time execution is interrupted in connection with the select signal transitioning to the second logic state, the results of the test pattern execution are captured using one clock pulse CK2 in the second flip-flops 212 operating in capture mode, while the states of the first flop-flops 112 are preserved because the clock CK1 is inactive at that time. Then, the select signal transitions back to the first logic state and the result of the test is shifted out (reference 412) to the on-chip test checker logic through the second flip-flops 212 operating in shift mode responsive to clock CK2. Simultaneously, the next test pattern is injected through the scan in of the second flip-flops 212, while the first flip-flops 112 are reactivated to support run-time functional execution in response to clock CK1.

Figure 5:
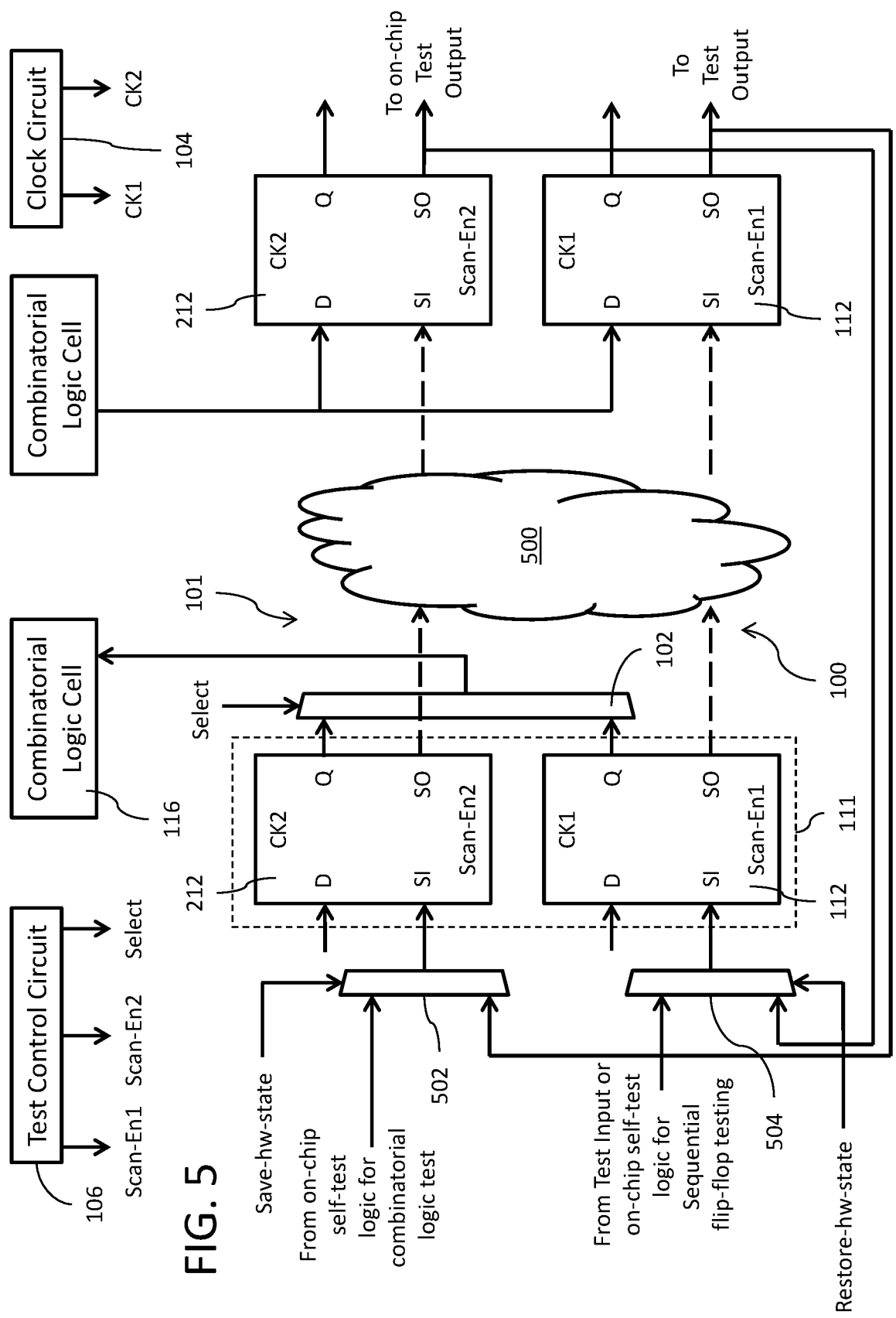
FIG. 5 is a circuit diagram for a testing circuit implemented with the circuit of FIG. 3.

It may be desirable to also test the functional operation of the flip-flops 112. Reference is made to FIG. 5 showing a testing circuitry for supporting testing of the flip-flops 112. In FIG. 5, the reference 500 stands in place of the chain of flip-flops for the first and second scan chains 100 and 101, respectively, which have been omitted from the figure so that emphasis can be made in the figure to the testing circuitry. So, only the first and last flip-flops 112 and 212 are shown in FIG. 5, it being understood that each scan chain 100 and 101 may include many more additional flip-flops connected in the manner shown in FIG. 3.

A first multiplexer 502 has a first input coupled to the scan output (SO) of the last one of the first flip-flops 112 in the scan chain 100, and has a second input coupled to receive self test data for combinatorial logic testing. For example, such data may be sourced by on-chip self-test logic. The output of the first multiplexer 502 is coupled to the scan input (SI) of the first one of the second flip-flops 212 in the scan chain 101. The multiplexer 502 is controlled by a save hardware state signal (Save-hw-state). When the save hardware state signal is in a first logic state, the multiplexer 502 passes the signal from the last one of the first flip-flops 112 in the scan chain 100 to the scan input (SI) of the scan chain 101. Conversely, when the save hardware state signal is in a second logic state, the multiplexer 502 passes the self test data to the scan input (SI) of the scan chain 101.

A second multiplexer 504 has a first input coupled to the scan output (SO) of the last one of the second flip-flops 212 in the scan chain 101, and has a second input coupled to receive self test data for sequential cell testing. For example, such data may be sourced by on-chip self-test logic, or may be input through a test input pin. The output of the second multiplexer 504 is coupled to the scan input (SI) of the first one of the first flip-flops 112 in the scan chain 100. The multiplexer 504 is controlled by a restore hardware state signal (Restore-hw-state). When the restore hardware state signal is in a first logic state, the multiplexer 504 passes the signal from the last one of the second flip-flops 212 in the scan chain 101 to the scan input (SI) of the scan chain 100. Conversely, when the restore hardware state signal is in a second logic state, the multiplexer 504 passes the self test data to the scan input (SI) of the scan chain 100.

Figure 6:
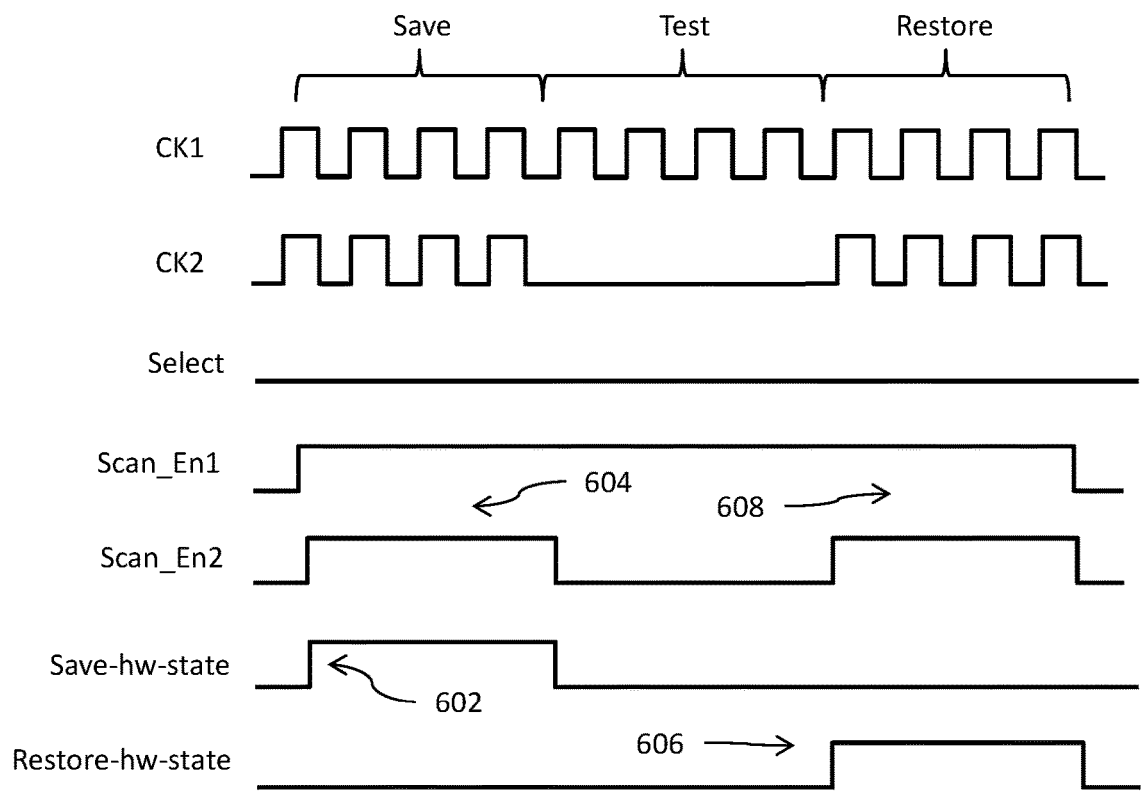
FIG. 6 is a waveform diagram for operation of the circuit of FIG. 5.

The testing circuit operates as follows (see, FIG. 6):

Before testing the functional flip-flops 112 of the scan chain 100, the logic states of those flip-flops must be saved. To accomplish this, the save hardware state signal is asserted at reference 602 and the last scan output (SO) of the scan chain 100 is passed by first multiplexer 502 for storage in the first flip-flop 212 of the scan chain 101. With both scan chains 100 and 101 configured in shift (scan) mode through the scan enable signals (reference 604), the initial contents of scan chain 100 are transferred to the scan chain 101 after a certain number of clock pulses for CK1 and CK2 which match the number of flip-flops present in each scan chain. The save phase ends when the save hardware state signal is deasserted.

Next, the clock CK2 is stopped and the test phase is entered. The pattern for testing the functional flip-flops 112 of scan chain 100 in injected. The restore hardware state signal is in the logic state for causing cause the second multiplexer 504 to pass the test data for sequential FF testing into the flip-flops 112 of the scan chain 100 in response to the clock CK1. Testing is performed and the results are read out from the scan chain 100. The state of the scan chain 101 with flip-flops 212 is preserved at this time because the CK2 clock is inactive.

After execution of the last pattern for the test data for sequential FF testing in the scan chain 100, the test phase ends and the initial values of the data for the first flip-flops 112 must be restored. To accomplish this, the restore hardware state signal is asserted at reference 606 for the restore phase and the last scan output (SO) of the scan chain 101 is passed by second multiplexer 504 for storage in the first flip-flop 112 of the scan chain 100. With both scan chains 100 and 101 configured in shift (scan) mode through the scan enable signals (reference 608), the contents of scan chain 101 are transferred to the scan chain 100 after a certain number of clock pulses for CK1 and CK2 which match the number of flip-flops present in each scan chain.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A circuit for testing a combinatorial logic circuit, comprising:
    a first scan chain comprised of a plurality of first flip-flops having data inputs connected to outputs of the combinatorial logic circuit;
    a second scan chain comprised of a plurality of second flip-flops having data inputs connected to said outputs of the combinatorial logic circuit, wherein the second flip-flops selectively operate in a shift mode or a capture mode in response to a scan enable signal;
    wherein a data output of the first scan chain is connected to an input of the combinatorial logic circuit at a same time that the scan enable signal causes the plurality of second flip-flops of the second scan chain to operate in shift mode; and
    wherein a data output of the second scan chain is connected to said input of the combinatorial logic circuit at a same time that the scan enable signal causes the plurality of second flip-flops of the second scan chain to operate in capture mode.

2. The circuit of claim 1,
    wherein a scan output of one first flip-flop of the plurality of first flip-flops in the first scan chain is connected to a scan input of a next first flip-flop of the plurality of first flip-flops in that first scan chain; and
    wherein a scan output of one second flip-flop of the plurality of second flip-flops in the second scan chain is connected to a scan input of a next second flip-flop of the plurality of second flip-flops in that second scan chain.

3. The circuit of claim 2, further comprising a selection multiplexer having a first input coupled to a data output of said one first flip-flop and a second input coupled to a data output of said one second flip-flop, and wherein an output of the selection multiplexer is coupled to said input of the combinatorial logic circuit.

4. The circuit of claim 2, wherein a same one of the outputs of said combinatorial logic circuit is coupled to the data inputs of both the next first flip-flop and the next second flip-flop.

5. The circuit of claim 1, further comprising a feedback of a scan output of a last second flip-flop in the second scan chain to a scan input of an initial first flip-flop in the first scan chain.

6. The circuit of claim 5, wherein said feedback includes a selection circuit configured to pass data from the scan output of the last second flip-flop in the second scan chain to the scan input of the initial first flip-flop in the first scan chain in response to a first mode selection and pass test data to the scan input of the initial first flip-flop in the first scan chain in response to a second mode selection.

7. The circuit of claim 1, further comprising a feedback of a scan output of a last first flip-flop in the first scan chain to a scan input of an initial second flip-flop in the second scan chain.

8. The circuit of claim 7, wherein said feedback includes a selection circuit configured to pass data from the scan output of the last first flip-flop in the first scan chain to the scan input of the initial second flip-flop in the second scan chain in response to a first mode selection and pass test data to the scan input of the initial second flip-flop in the second scan chain in response to a second mode selection.

9. A circuit for testing a combinatorial logic circuit, comprising:

a first scan chain comprised of a plurality of first flip-flops, each first flip-flop having a data input, and wherein the data input of one first flip-flop of the plurality of first flip-flops is connected to an output of the combinatorial logic circuit;

a second scan chain comprised of a plurality of second flip-flops, each second flip-flop having a data input, and wherein the data input of one second flip-flop of the plurality of second flip-flops is connected to said output of the combinatorial logic circuit, and wherein the second flip-flops of the second chain selectively operate in a shift mode or a capture mode in response to a scan enable signal;

a selection circuit configured to:
connect a data output of the one first flip-flop of the first scan chain to an input of the combinatorial logic circuit when the scan enable signal causes the plurality of second flip-flops of the second scan chain to operate in the shift mode; and connect a data output of the one second flip-flop of the second scan chain to said input of the combinatorial logic circuit when the scan enable signal causes the plurality of second flip-flops of the second scan chain to operate in the capture mode.

10. The circuit of claim 9,
wherein a scan output of the one first flip-flop of the plurality of first flip-flops in the first scan chain is connected to a scan input of a next first flip-flop of the plurality of first flip-flops in the second scan chain; and
wherein a scan output of the one second flip-flop of the plurality of second flip-flops in the second scan chain is connected to a scan input of a next second flip-flop of the plurality of second flip-flops in the second scan chain.

11. The circuit of claim 9, wherein the selection circuit is a selection multiplexer having a first input coupled to the data output of the at least one first flip-flop in the first scan chain and having a second input coupled to the data output of the at least one second flip-flop in the second scan chain.

12. The circuit of claim 9, further comprising a feedback of a scan output of a last second flip-flop in the second scan chain to a scan input of an initial first flip-flop in the first scan chain.

13. The circuit of claim 12, wherein said feedback includes a selection circuit configured to pass data from the scan output of the last second flip-flop in the second scan chain to the scan input of the initial first flip-flop in the first scan chain in response to a first mode selection and pass test data to the scan input of the initial first flip-flop in the first scan chain in response to a second mode selection.

14. The circuit of claim 9, further comprising a feedback of a scan output of a last first flip-flop in the first scan chain to a scan input of an initial second flip-flop in the second scan chain.

15. The circuit of claim 14, wherein said feedback includes a selection circuit configured to pass data from the scan output of the last first flip-flop in the first scan chain to the scan input of the initial second flip-flop in the second scan chain in response to a first mode selection and pass test data to the scan input of the initial second flip-flop in the second scan chain in response to a second mode selection.

* * * * *